United States Patent
Nirschl et al.

(10) Patent No.: US 8,243,532 B2
(45) Date of Patent: Aug. 14, 2012

(54) NVM OVERLAPPING WRITE METHOD

(75) Inventors: Thomas Nirschl, Munich (DE); Christoph Bukethal, Dresden (DE); Jan Otterstedt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 241 days.

(21) Appl. No.: 12/702,759

(22) Filed: Feb. 9, 2010

(65) Prior Publication Data
US 2011/0194364 A1   Aug. 11, 2011

(51) Int. Cl.
*G11C 7/22* (2006.01)
(52) U.S. Cl. .......... 365/189.16; 365/189.12; 365/233.11
(58) Field of Classification Search ............. 365/189.16, 365/189.12, 233.11
See application file for complete search history.

(56) References Cited

U.S. PATENT DOCUMENTS

| | | | |
|---|---|---|---|
| 5,430,674 A | 7/1995 | Javanifard | |
| 6,205,081 B1 * | 3/2001 | Lee | 365/230.08 |
| 6,542,411 B2 * | 4/2003 | Tanikawa et al. | 365/185.33 |
| 6,747,893 B2 | 6/2004 | Uribe et al. | |
| 6,809,962 B2 | 10/2004 | Uribe et al. | |
| 7,280,392 B2 | 10/2007 | Liaw et al. | |
| 7,376,015 B2 * | 5/2008 | Tanaka et al. | 365/185.22 |

* cited by examiner

*Primary Examiner* — Pho M Luu
(74) *Attorney, Agent, or Firm* — Eschweiler & Associates, LLC (57) ABSTRACT

A structure and method for increasing the operating speed and reducing the overall programming time of a memory array are provided herein. The method and structure reduce the maximum write current consumption, for writing a plurality of data bits to a NVM array, by writing the data bits sharing an activated word line at different times (e.g., activating bit lines associated with an activated word line at different times). The write operation of respective data bits, which individually utilize only a fraction of the overall write window of the bits, are interleaved so that the maximum write current of respective bits are offset in time from the maximum write current of another bit, allowing a larger number of data bits to be written without exceeding system specifications (e.g., maximum current) and reducing overall memory write time.

20 Claims, 7 Drawing Sheets

NVM OVERLAPPING WRITE METHOD

FIELD OF INVENTION

The present invention relates generally to memory and in particular to a method and apparatus for increasing the operating speed and reducing the overall programming time of a memory array.

BACKGROUND OF THE INVENTION

There are two basic types of memory, volatile memory and nonvolatile memory. Volatile memory (e.g., DRAM, SRAM, etc.) comprises devices that lose any content stored in them when they lose power. Conversely, non-volatile memory (e.g., flash, EEPROM, FeRAM, etc.) comprises devices that retain any content stored in them even when they are not powered.

Typically, a non-volatile memory (NVM) cell is formed using either a charge trapping device or a floating gate MOS device.

In a charge trapping device, a non-conductive charge trapping layer is vertically displaced between a gate and an underlying substrate, comprising a source and a drain. When a potential difference is applied to the gate and the source/drain, an electric field is generated in the device, providing charge carriers (e.g., electrons, holes) to the charge trapping layer. When the electric field is removed, the charge carriers are trapped in the charge trapping layer where they corresponding to a data state (e.g., a "0" or "1"). Alternatively, the charge trapping layer may be horizontally placed between two materials.

Figure 1:
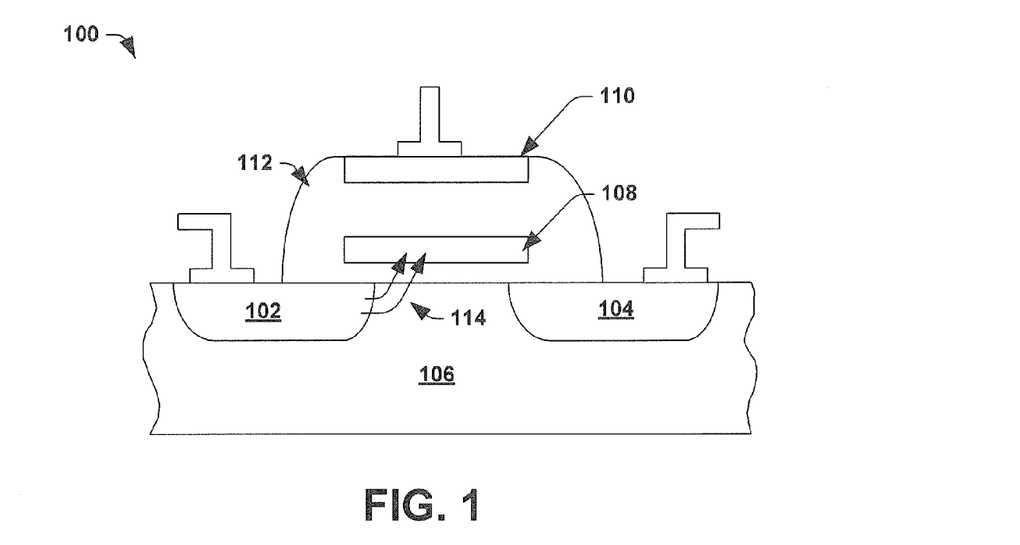
FIG. 1 illustrates a schematic diagram of an exemplary non-volatile memory cell comprising a floating gate metal-oxide-semiconductor device.

FIG. 1 illustrates a schematic diagram 100 of an exemplary non-volatile memory (NVM) cell comprising a floating gate metal-oxide-semiconductor (MOS) device. The floating gate MOS device comprises a transistor having a source/drain 102, a drain/source 104, a control gate 110, and a floating gate 108. The source/drain 102 and drain/source 104 are comprised within the substrate 106 of the semiconductor body. The control gate 110 is located vertically above the source 102 and the drain 104. The floating gate 108 is disposed between the substrate 106 (comprising source 102 and drain 104) and the control gate 110 and is electrically isolated from the substrate 106 and control gate 110 by a dielectric material 112. The dielectric material 112 between the floating gate 108 and the substrate 106 comprises a thin gate oxide layer (e.g., a thin silicon dioxide layer) or a stack of different dielectric layers (e.g. comprising dielectrics with different dielectric constants).

During operation, programming (e.g., writing data to) the NVM cell may be performed by transferring charge carriers (e.g., electrons, holes) from the substrate (e.g., the source and/or the drain) to the floating gate 108 by tunneling through the thin gate oxide layer (e.g., exemplary charge carrier motion illustrated as 114). In particular, a voltage may be applied to the source/drain region 102 of the device and a corresponding voltage may also be applied to the control gate 110. Such biasing providing a potential at the floating gate that is lower in absolute value than the potential of the drain resulting in an electric field that causes 'hot electrons' or 'hot holes' to be injected, from the source/drain, to the floating gate by tunneling through the thin gate oxide. When the electric field is removed, the electrons become trapped in the electrically isolated floating gate where they correspond to a stored data state (e.g., a "1" or "0").

DETAILED DESCRIPTION OF THE INVENTION

The present invention will now be described with reference to the attached drawing figures, wherein like reference numerals are used to refer to like elements throughout, and wherein the illustrated structures and devices are not necessarily drawn to scale.

Over the past decade, non-volatile memory (e.g., flash, EEPROM, FeRAM, PCRAM, MRAM, etc.) has come to be widely used to store electronic information. Non-volatile memory (NVM) offers a number of advantages over other types of memory, most notably that it can store data without the requirement for a power supply being turned on. This makes it ideal for portable electronic devices having a limited battery life. For example, flash memory, a type of non-volatile memory, is commonly used in many portable electronic devices (e.g., cell phones, cameras, etc.) that provide electronic data storage at a low power.

Figure 2:
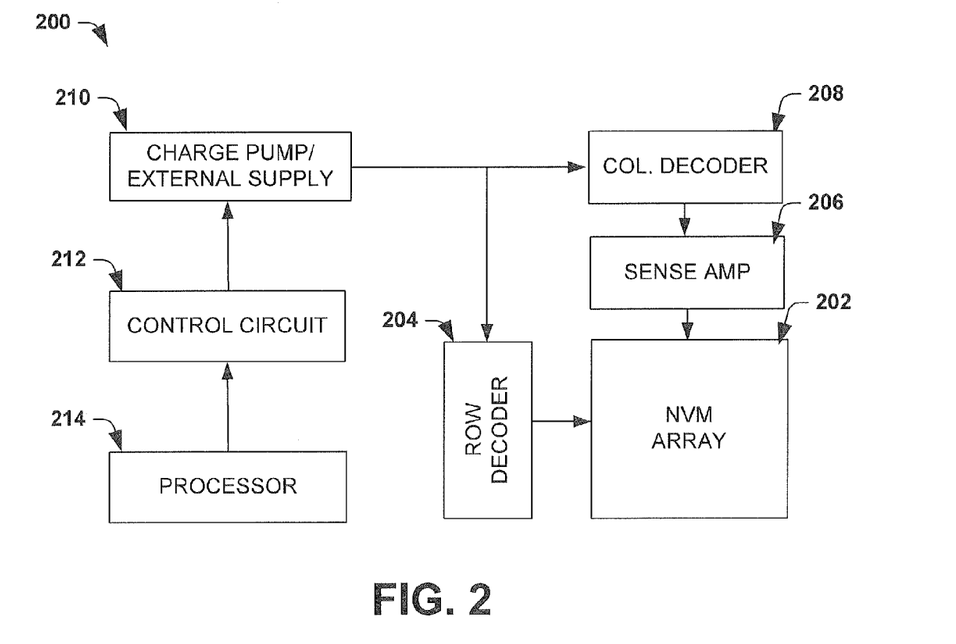
FIG. 2 illustrates a block diagram of a system that may be used to program a NVM array.

FIG. 2 illustrates an exemplary block diagram of a system 200 that may be used to program (e.g., write data to) a NVM array. It will be appreciated that the system 200 may comprise additional components not shown. As illustrated in FIG. 2, the memory array 202 may comprise a NVM array of flash memory cells (e.g., NAND flash, NOR flash), EEPROM memory cells, or other types of non-volatile memory cells, arranged in rows and columns. A row decoder 204, a column decoder 208, and a sense amplifier 206 are coupled to the memory array 202 and are configured to allow a control circuit 212 to selectively access and write rows and columns of the memory array 202 by applying an appropriate voltage and current to devices of the NVM array.

The column decoder 208 and the row decoder 204 are further coupled to a charge pump 210 or an external supply that is configured to generate a current, from low system voltages, having a relatively high voltage and current. The operation of the charge pump 210 is controlled by the control circuit 212, which is coupled to a system processor 214 (e.g., a microprocessor). The control circuit 212 provides signals used to control operations of the memory array 202 such as reading data, writing data, and erasing data.

It will be appreciated that the methods and apparatus, provided herein, may be utilized with a wide range of memory architectures. For example, in two exemplary embodiments the methods and apparatus may be used in conjunction with various architectures of NOR flash memory (e.g., NOR architectures have a common word line, a shared word line, etc.) or with various architectures of NAND flash memory (e.g., NAND architectures have a common word line, a shared word line, etc.).

Figure 3:
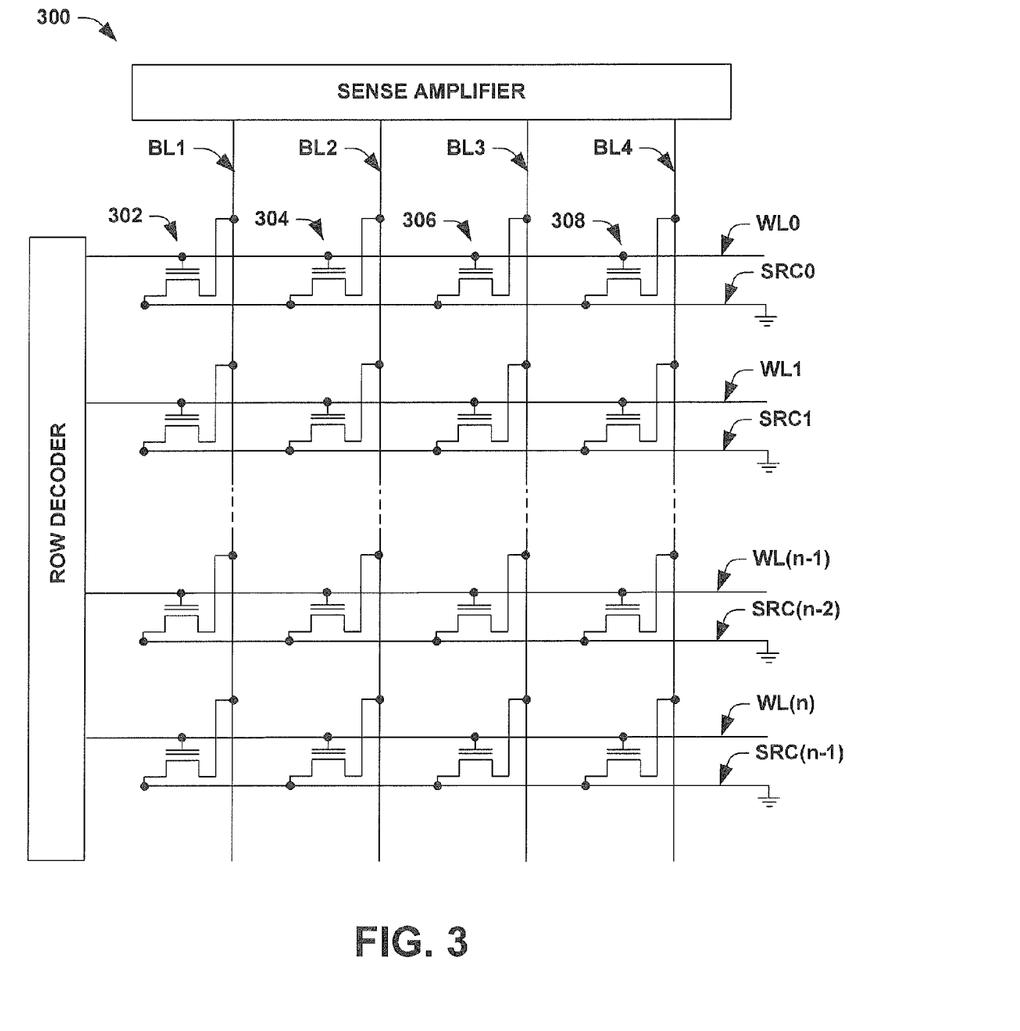
FIG. 3 illustrates an exemplary non-volatile NOR flash memory array.

To facilitate understanding of the invention, provided herein, FIG. 3 illustrates a more detailed example of a non-volatile NOR flash memory array 300 (e.g., corresponding to element 202 in FIG. 2). The memory array 300 comprises a plurality of floating gate MOS transistor devices (e.g., devices 302, 304, etc.) that are configured to store charges corresponding to data bits. The transistors are arranged in a configuration comprising rows and columns.

In particular, respective MOS devices (e.g., devices 302, 304, etc.) have a first terminal coupled to a bit line (e.g., BL1, BL2, etc.) and a second terminal coupled to a shared or single source line (e.g., SRC0, SRC1, . . . ). FIG. 3 illustrates the MOS devices sharing a word line respectively having a second terminal coupled to a shared source line that is further coupled to a ground terminal. Alternatively, the plurality of floating gate MOS devices, comprising the memory array, may respectively have second terminals that are coupled to a common source line (e.g., the common source line extending along the 'bottom' of the memory array and connected to respective rows of the memory array).

The MOS devices are further coupled to a word line (e.g., WL0, WL1, etc.) at their respective gates. Respective memory cells may comprise either a single device, which acts as a select device and storage element, or a single device, which acts as a select device, and a separate storage device (e.g. a PCRAM element, a MRAM element, or a floating gate device).

Data may be written (i.e., programmed) to respective memory cells of the memory array by selectively applying a bias condition, to a memory cell. For example, when a voltage greater than the threshold voltage of the transistor (e.g., 302) is applied to a word line (e.g., WL0) a transistor (e.g., 302) turns on, coupling the storage element to the bit line (e.g., BL1). A bit line (e.g., BL1, BL2) is then raised, applying a voltage to the source/drain region of the device and resulting in an electric field within the device that causes 'hot electrons' or 'hot holes' to be injected, from the source/drain, to the floating gate (e.g., as shown at 114 in FIG. 1). When the electric field is removed, the electrons become trapped or stored in the electrically isolated floating gate where they correspond to a stored data state (e.g., a logic "1" or "0").

Figure 4:
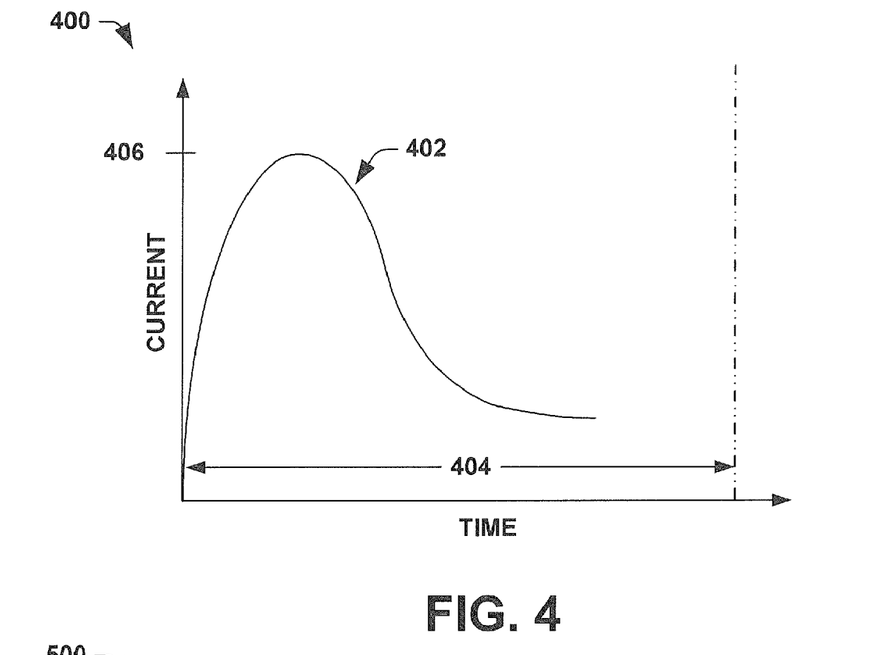
FIG. 4 is a current vs. time graph illustrating an exemplary write current provided to a bit line of a memory array for writing a single data bit to a memory cell.

To successfully perform hot electron or hot hole injection the charge pump must provide a relatively high voltage and current to respective bit lines of a NVM array. FIG. 4 is a current vs. time graph illustrating an exemplary write current 402 (e.g., provided to a bit line from a charge pump or external supply) used for writing a single data bit to a memory cell, wherein time is shown on the x-axis and current is shown on the y-axis. As illustrated in FIG. 4, the write current 402 will operate with a high write current for only a fraction of the overall write window 404 of a memory cell. After the short peak 406, the current decays over the remainder of the write window.

To increase operating speed of NVM arrays multiple data bits of a data word (i.e., stored in memory cells located in multiple columns sharing a common word line) are often written in parallel. Data bits can be written in parallel to multiple memory cells sharing a common word line by concurrently activating the word line and multiple bit lines. For example, referring again to FIG. 3, data bits of a data word can be written in parallel to memory cells 302, 304, and 306 by activating word line WL0 and concurrently sending a write signal to bit lines BL1, BL2, and BL3.

Figure 5:
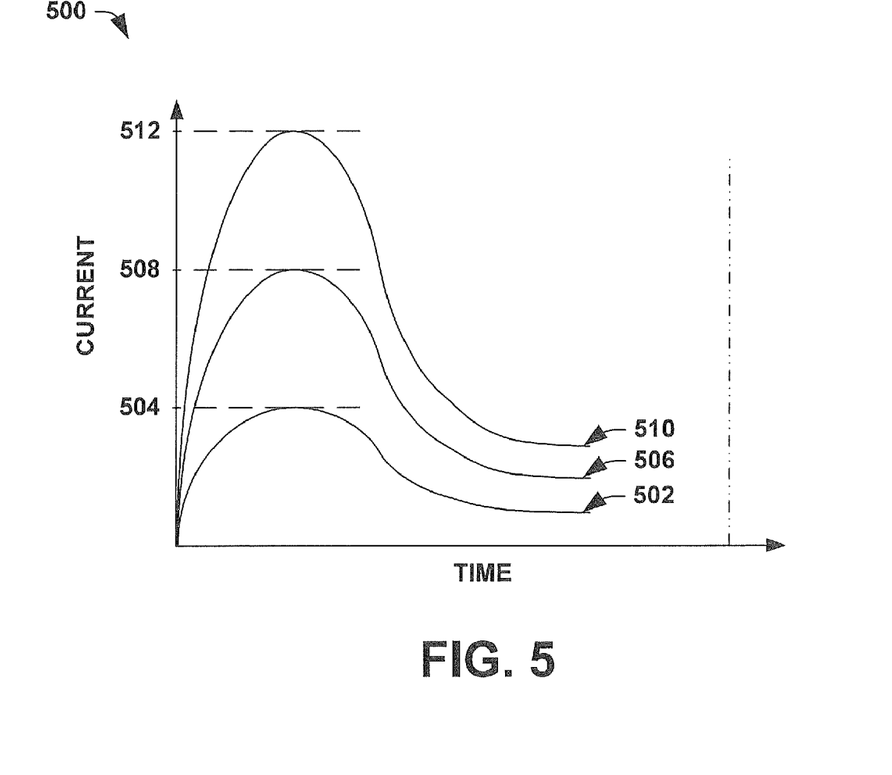
FIG. 5 is a current vs. time graph illustrating an exemplary write current used for writing a multiple data bits to multiple memory cells in parallel.

However, the activation of multiple bit lines of a NVM array, to write data bits in parallel, utilizes a large write current, as illustrated in FIG. 5. FIG. 5 is a current vs. time graph illustrating an exemplary write current (e.g., provided by the charge pump or external supply to supply multiple bit lines) used for writing multiple data bits to multiple memory cells in parallel. As illustrated in FIG. 5, writing a first data bit may be accomplished with a write current 502 having a maximum write current 504 (e.g., 10 uA). However, writing a first and a second bit in parallel utilizes a larger write current 506 (e.g., substantially equal to twice write current 503) having a maximum write current 508 (e.g., 20 uA). Furthermore, writing a first, second, and third bit written in parallel utilizes a still larger write current 510 (e.g., substantially equal to three times write current 503) having a maximum write current 512 (e.g., 30 uA). Therefore, the inventors have appreciated that the total write current utilized to write data bits limits the number of bits that can be written in parallel, due to limitations provided by system specifications (e.g., the maximum current that can be provided by the charge pump or the circuit's power supply). For example, if a single data bit can be written with 10 uA, an overall current of 100 uA would only allow for 10 bits to be written to a row of memory cells in a NVM array in parallel. Practically, this means that when a certain amount of data bits (x) is to be written, blocks of 10 bits data are written to the memory in parallel until all x bits are written.

Accordingly, the present invention relates to a method and circuit that increase the operating speed and reduce the overall programming time of a memory array. More particularly, the method and apparatus provided herein reduces the maximum write current consumption, for writing a plurality of data bits to a NVM array, by writing the data bits sharing a common word line at different times (e.g., activating bit lines associated with a common word line at different times) and thereby interleaving the write window for consecutive bits to be written to a memory array.

Specifically, in one embodiment, the write operation of respective data bits to be written to a column of a memory array are interleaved so that the maximum write current of each data bit is offset in time from the maximum write current of another bit. Individually, the write operation of respective data bits utilizes only a fraction of the overall write window of the bits. Therefore, interleaving of data bit write windows allows a larger number of data bits to be written without exceeding system specifications (e.g., maximum current of the charge pump or an external supply) resulting in a reduced total write time.

Figure 6:
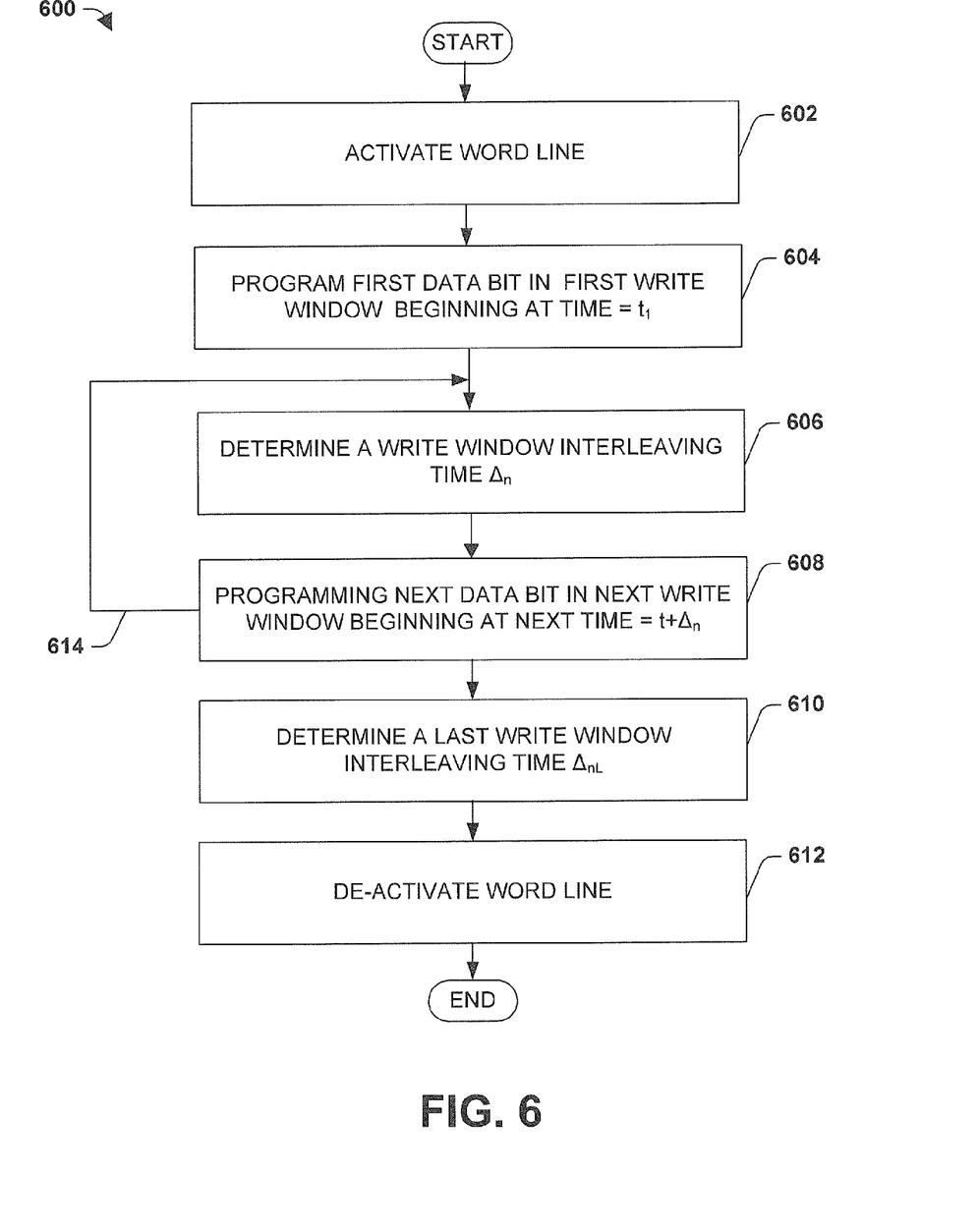
FIG. 6 illustrates an exemplary method of interleaving the write window for consecutive bits of data to be written to a memory array.

FIG. 6 illustrates an exemplary method of interleaving the write window for consecutive data bits to be written to a memory array. The method provides for a delay between the start of writing respective data bits of a data word, resulting in a reduced maximum write current consumption and thereby reducing the total data word write time.

While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, it will be appreciated that the one or more isolation cavities are formed by processing methods which are compatible with presently used technologies, and which result in only minor modifications to the current process sequence.

At 602 a word line is activated. The word line may be activated according a signal received from a control circuit attempting to write a data word, comprising a plurality of data bits, to a NVM array.

Figure 7:
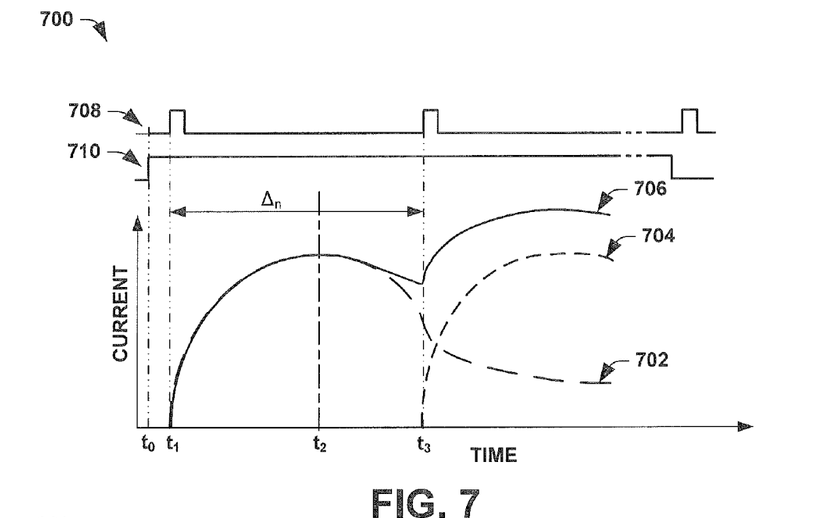
FIG. 7 is a current vs. time graph illustrating the write current used for writing multiple data bits having interleaved write windows as provided herein.

FIG. 7 illustrates a current versus time graph 700 of a write current for an exemplary NVM array (e.g., corresponding to NVM array 300). FIG. 7 also illustrates a clock signal 708 associated with a control circuit coupled to the exemplary NVM array and a word line signal 710. As illustrated in FIG. 7, the word line signal is raised at time t0 thereby activating a word line associated with a first column.

A first data bit is written to a NVM array at 604. The first data bit may be written to a NVM cell by activating a first bit line (i.e., providing a first write bias condition), at a time $t_1$. The activated bit line will write the first data bit to a memory cell coupled to the activated word line. In one embodiment, a clock signal may be used to control the writing of the first data bit to a NVM cell. For example, the rising edge of a first clock signal (e.g., at time $t_1$) can be configured to cause a control circuit to selectively raise a bit line and thereby write a first data state to a NVM array. The flexibility of such clock signals allows for a flexible control of the current used to write data bits over time.

As illustrated in FIG. 7, at time $t_1$ a clock signal facilitates writing a first data bit to a first memory cell associated with the word line. The write current applied to a first bit line to write a first data bit is illustrated in FIG. 7 as line 702. In particular, the write current 702 used to write the first data bit reaches a maximum at time $t_2$ after which the write current begins to decrease.

At 606 a write window interleaving time $\Delta_n$ is determined. The write window interleaving time $\Delta_n$ is the time between the beginning of successive data bit write windows, wherein a write window comprises the time it takes to write a data bit to a NVM cell (i.e., a write window begins at the start of writing a data bit and ends when writing a data bit is completed). For example, the write window interleaving time $\Delta_n$ may comprise the time between the start of writing a first data bit to a first memory cell and the start of writing a next data bit to a next memory cell. It will be appreciated that the write window interleaving time $\Delta_n$ may be dynamically changed in the course of writing a data word (e.g., $\Delta_n$ between writing a first and second data bit may be larger or smaller than $\Delta_n$ between writing a second and third data bit).

The write window interleaving time $\Delta_n$ may be determined to result in a total write current that is within the system specifications (e.g., less than the total write current that a system can provide). In one embodiment, the write window interleaving time is chosen so that the maximum current of successive data bits, written to NVM array, is not substantially coincident in time. In another embodiment, the write window interleaving time $\Delta_n$ is less than the time that that it takes to write an entire data bit to a NVM cell. In another embodiment, the write window interleaving time $\Delta_n$ may comprise a time value that allows the current used to write the first data bit to decrease below a certain predetermined non-zero threshold prior to writing a subsequent data bit. In yet another embodiment, the write window interleaving time $\Delta_n$ is chosen to result in a total write current that is substantially smooth over time relative to the write current of a single data bit.

A next data bit is written a next time $t+\Delta_n$ at 608. The next data bit may be written to a NVM cell by activating a next bit line (i.e., providing a next write bias condition), sharing the activated word line, at a subsequent time (e.g., after time first write bias condition has reached a maximum value). Similar to the first data bit, a clock signal (e.g., 708) may be utilized to control the writing of the next data bit to a NVM cell. For example, the rising edge of a next clock signal (e.g., at time $t_3$) can be configured to cause a current control circuit to selectively raise a bit line and thereby write the next data bit to the NVM array.

It will be appreciated that time t may be equal to time $t_1$ for a data bit being written immediately after the first data bit. Alternatively, time t may be equal to a later time for subsequently written data bits. For example, as shown in FIG. 7 the time t may be equal to time $t_3$ (e.g., providing for a next data bit to be written at a next data bit is written a next time $t_3+\Delta_n$) for a data bit being written immediately after a second data bit, wherein the second data bit is written at a next time $t_3=t_1+\Delta_n$. In other words, the notation time t is used to allow for multiple write iterations according to method 600.

The write current (i.e., write bias condition) used to write the second data bit is illustrated in FIG. 7 as line 704. As illustrated in FIG. 7, at time $t_3$ a clock signal facilitates writing a second data bit to a second memory cell associated with the word line. The time $t_3$, at which the write current is applied to a second bit line to write a second data bit, is located chronologically after the current used to write the first data bit has reached its maximum and begun to decrease. This causes the total current 706 used to write the first and second data bit (e.g., the sum of currents 702 and 704 to have a total write current value that is less than the sum of the maximum write of the first and the second data bits.

Additional bits may be written to the same word in a similar manner as illustrated by arrow 614. In particular, additional bits may be written to the same word by repeating actions 606-608. It will be appreciated that these actions may be performed until all bits of a word have been written to the NVM memory.

At 610 a last write window interleaving time $\Delta_{nL}$ is determined. The last write window interleaving time provides a write time for the last data bit to be written. Accordingly, after a last write bias condition is applied to a last bit line the system will wait for a last write window interleaving time $\Delta_{nL}$ before in 612 the word line is de-activated.

Therefore, as provided by method 600, data bits of a data word sharing a common word line are written at different times, thereby interleaving the write window of data bits and providing for a reduced total write current. This results in a write current that does not exceed system specifications and furthermore a write current that allows for more data bits to be written in a shorter time by utilizing a more uniform current (e.g., a lower median current) over the write time of a data word.

Figure 8:
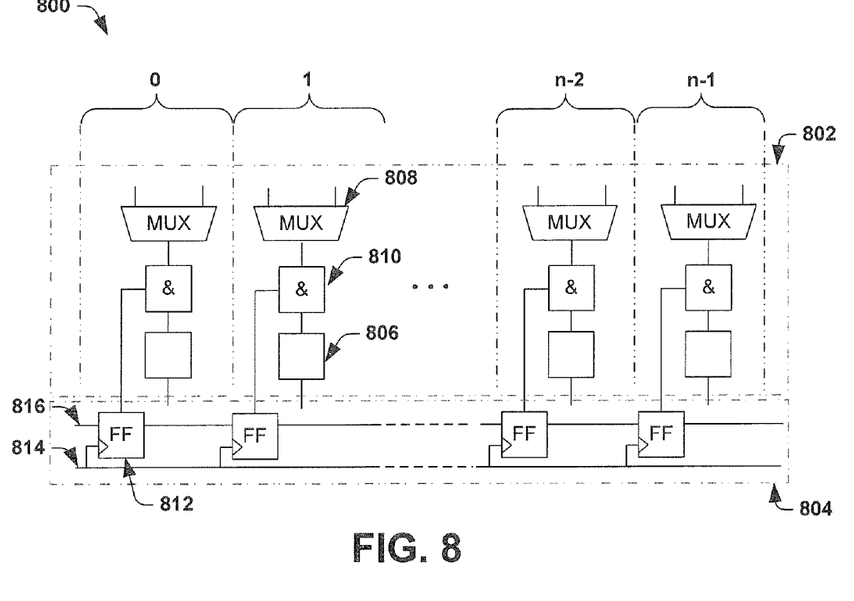
FIG. 8 illustrates a block diagram of a write throughput control circuit as provided herein.

FIG. 8 illustrates an exemplary write throughput control circuit 800 configured to reduce a total write time of data bits to a non-volatile memory without using a maximum current consumption that exceeds system specifications. The write throughput control circuit 800 comprises a control circuit 802 coupled to a shift register 804. The control circuit 802 is configured to write data to multiple bits of a data word stored in memory by selective activation of a common word line and one or more bit lines (e.g., by providing one or more write bias conditions). The shift register 804 is configured to delay the activation of the one or more bit lines sharing the common word line and accordingly to interleave the write windows of various data bits being written to a row of a NVM array.

More particularly, the control circuit 802 may comprise a state machine, a sequencer, or some other type of controller. In one embodiment, shown in FIG. 8, the control circuit 802 comprises a plurality of I/O's (e.g., labeled 0, 1, ... n−2, n−1). Each I/O has a data-in latch 806 and a multiplexor (MUX) 808 that is connected to multiple bit lines of a NVM array. In various embodiments, the MUX 808 may comprise an adder or any circuit that facilitates adjustment of the output of the current controller. Logic 810 and the shift register 804, reaching through all the I/Os, are configured between the MUX 808 and the data-in latch 806. The logic 810 and the shift register 804 are configured to allow the current control circuit 800 to selectively activate a single I/O at a given time. For example, a first I/O may be activated to write a first data state at a first time and a second I/O (i.e., next I/O) may be activated to write a second data state at a second time later than the first time.

The shift register 804 comprises a plurality of flip flops 812, respectively sharing the same clock 814. The output of respective flip flops is coupled to logic 810 and the input of the next flip-flop in the register, resulting in a circuit that shifts by one position the one-dimensional bit array stored in it. As provided herein, the shift register 804 provides a delayed output of data stored in the register's flip flops.

In one embodiment, the delay of the shift register may be determined by the system clock 814 (e.g., an internal oscillator clock configured to provide high accuracy and flexibility), wherein the shift register will output data upon receiving a clock signal. For example, during operation data to be written to a NVM array is transferred to the data-in latch 806 and a block address is driven to the MUX 808. A clock signal 814 is received by the shift register and causing data, provided by bus 816, to be shifted through the shift register and to logic 810 (e.g., "shifting in" the data present at its input and "shifting out" the last bit in the array, when enabled to do so by a transition of the clock input). The data to be written to the NVM array may then be gated with the shift register allowing the maximum current and write to be adjusted flexibly.

Referring again to FIG. 7, the clock signals applied to the shift register 804 are illustrated at 708. When the clock signal 708 is set high at time $t_1$ the shift register 804 shifts data through the shift register causing a first I/O to write data to a NVM cell. Similarly, when the clock signal 708 is set high at time $t_3$, the shift register again shifts data through the register causing a second I/O to write data to a NVM cell (e.g., sharing a common word line 710).

Variations can be made to the frequency of the clock signal (i.e., to the write window interleaving time) to allow the shift register to easily and flexibly modify the current consumed. For example, the delay between write windows can be increased or decreased by issuing subsequent clock cycles at earlier or later times. Furthermore, the frequency of the clock cycles can be dynamically controlled to allow for even further flexibility. In one embodiment, by varying the write window interleaving time, the total write current is kept at a smooth and substantially steady current demand over time.

In one embodiment, the current control circuit is also configured to vary the number of data bits that are written in parallel by switching the I/O line of the shift register after multiple data bits have been written, thereby defining the number of bits that are written in parallel. This allows for an increased write speed by both writing data bits in parallel and by interleaving the write window of the bits being written in parallel.

In one embodiment, the current control circuit operates independently for different logical or physical parts of the memory module (e.g. a different block, wing or sector of the memory array).

Figure 9:
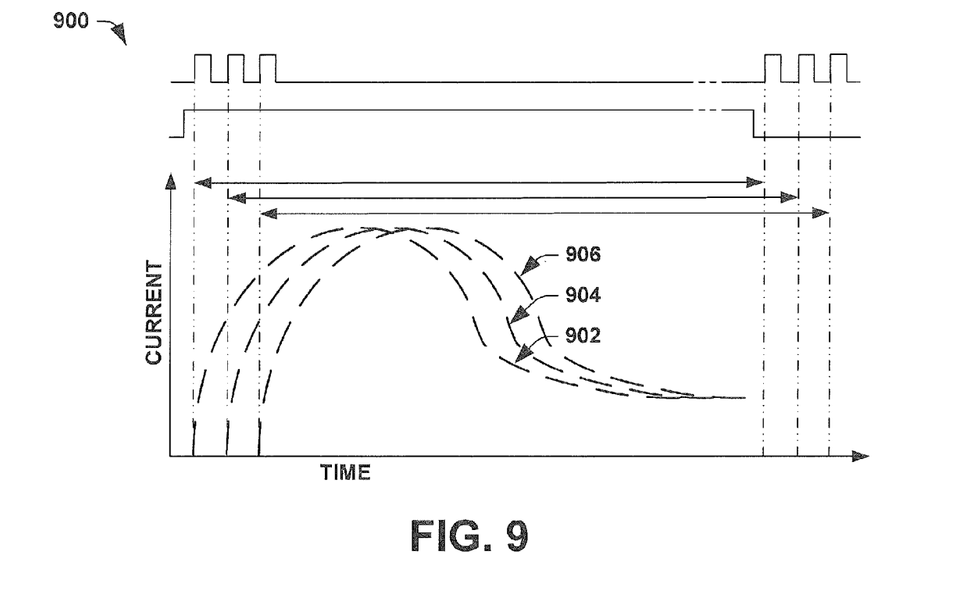
FIG. 9 is a current vs. time graph illustrating an alternative embodiment of the present invention, wherein multiple columns are written in parallel and interleaved with another group of columns.

For example, FIG. 9 illustrates a current v. time graph 900 showing the write currents, 902, 904, and 906, of three data bits written in parallel. The data bit writes are activated using three clock signals 908 that are shortly spaced in time followed by a longer delay. The clock signals 908 drive writing three data bits within a short period of time. A large time delay is provided while the write current of the three data bits decays prior to writing a second (i.e., next) series of three data bits (e.g., by a second series of three clock signals) in parallel.

Figure 10:
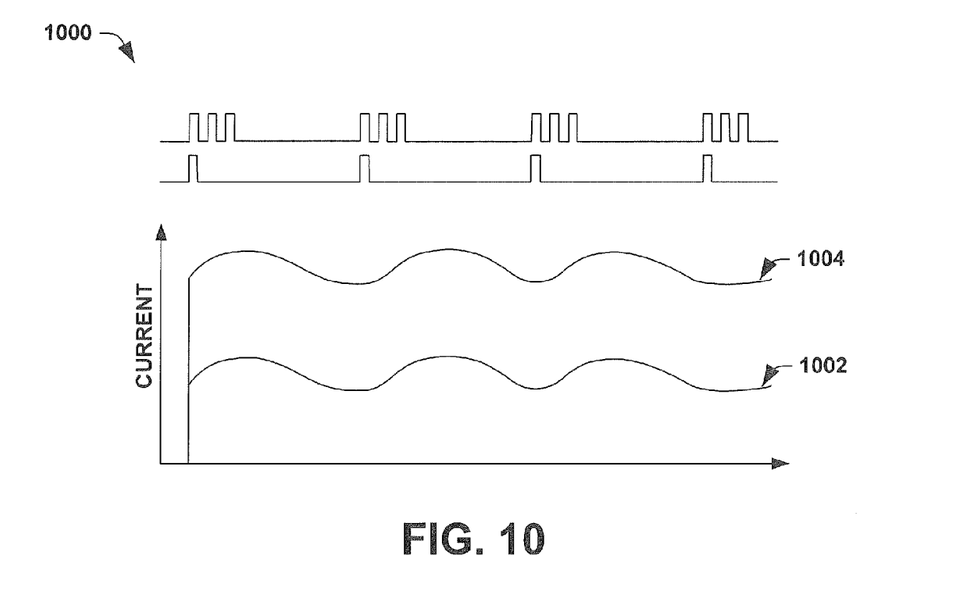
FIG. 10 is a current vs. time graph illustrating the total write current of a plurality of columns written in parallel and interleaved with another group of columns.

FIG. 10 illustrates a current v. time graph showing the resulting total write current for two different group configurations (e.g., writing a first and a second column in parallel). The first current series 1002 illustrates the current of a single data bit being written with an interleaved data window (e.g., as shown in FIG. 7). The second current series 1004 illustrates the current of three data bits written in parallel with an interleaved data window (e.g., as shown in FIG. 9). From the graph it can be seen that the total write current of the second series 1004 is greater than the total write current of the first series 1002 since the total write current of the second series 1004 may comprise the total current used to write the three data bits equals the sum of the write currents of the data bits (e.g., write currents 902, 904, and 906 as shown in FIG. 9)

The flexible variation in the write window interleaving time, as provided herein, allows the system to control based upon operating power constraints. For example, the write window interleaving time for a system having a limited power supply (e.g., operating from a battery) may be larger than the write window interleaving time for a system that is operating from a substantially unlimited power supply (e.g., plugged into a wall outlet). In one embodiment, the write window interleaving time may be configured to change depending on the power supply. Furthermore, the system may be configured to dynamically change the write window interleaving time (e.g., the frequency of a clock signal) during operation of the system.

For example, an electronic device taking power form an antenna may have maximum current values depending on the distance from the transmitter. When the device is far from the transmitter (e.g., with less power) it can increase the time between writing data bits and thereby reduce the overall write current (e.g., and reduce the number of bits written in parallel). However, when the device is close to the transmitter (e.g., with more power) it can decrease the time between writing data bits and thereby increase the overall write current (e.g., and increase the number of bits written in parallel).

Similarly, a system using a NVM array may be able to increase its write window interleaving time (i.e., and decrease the overall current to write data state) when the system is unplugged from a wall outlet to operate from a battery. In contrast, a system running from 110V can decrease the write window time to perform write operations as quickly as possible by writing more bits in parallel (e.g., using a larger maximum write current).

Furthermore, the write window interleaving time may be integrated with other power conservation techniques to manage system power. For example, if an electronic system is running out of power it can dynamically increase the write window interleaving time, thereby reducing the power consumption of the system (and also reducing performance of the memory).

In an additional embodiment, a current control circuit as provided herein can be configured to selectively bypass low data bits (e.g., "0") of a data word to be written to a NVM array. Bypassing the writing of low data bits can allow the system to increase overall write speed since low data bits do not typically require activation of bit lines. Instead, the current control circuit may concentrate on writing high data states (e.g., "1"), which utilize a large write current, to be written to a NVM array.

Figure 11:
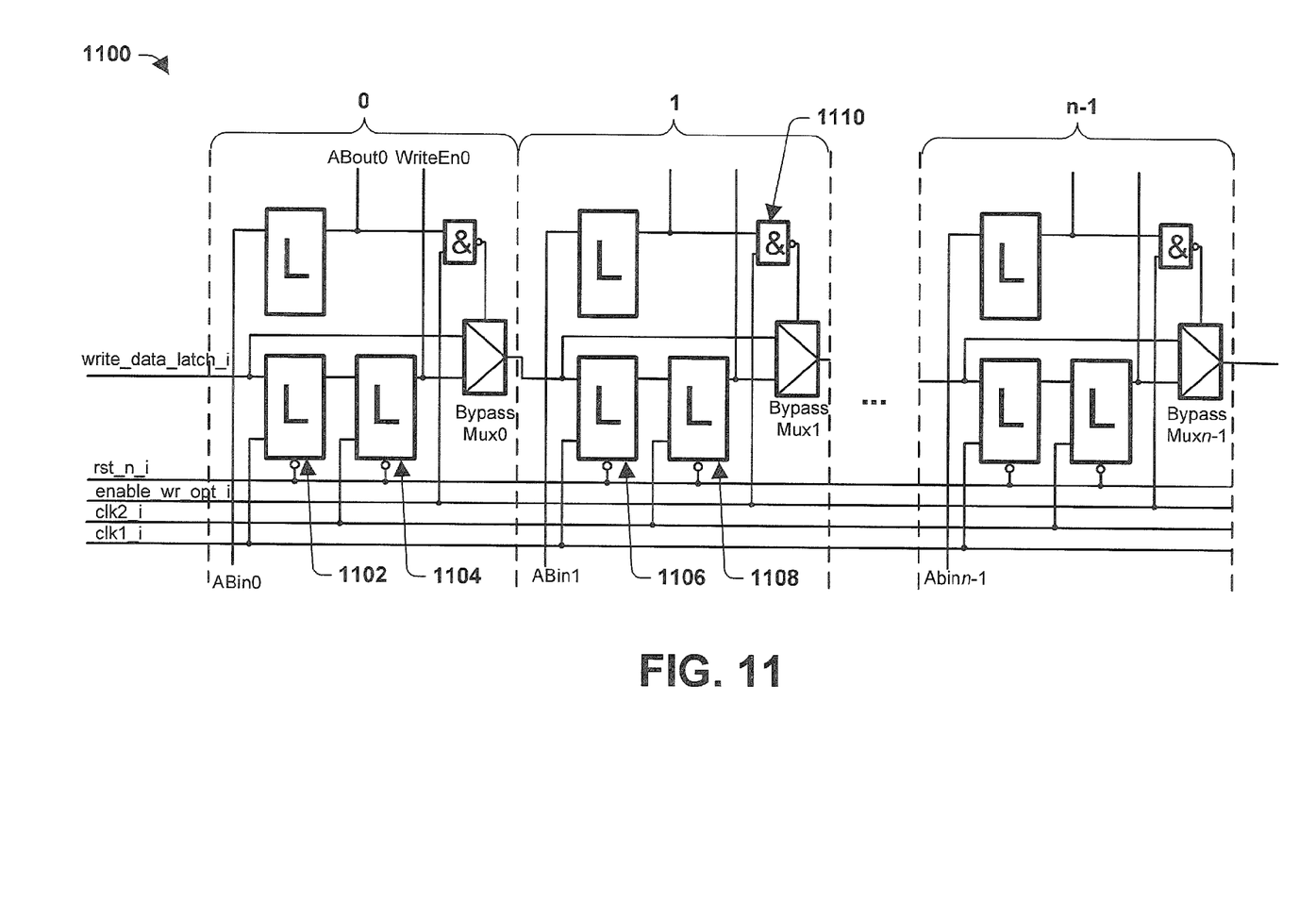
FIG. 11 illustrates a block diagram of a circuitry configured to allow a control circuit to bypass shift register flip flops depending on the data to be written by the I/O coupled to the flip-flop.

FIG. 11 illustrates one embodiment of a current control circuit 1100 comprising a circuitry configured to selectively bypass low data bits. For example, the control circuit of FIG. 11 allows the write operation can be skipped for data bits having a value of "0" for a data word comprising 0's and 1's. As illustrated in FIG. 11, logic (e.g., a bypass MUX) is provided to allow a system to bypass one or more flip-flops of a shift register (e.g., corresponding to shift register 804) depending on the data to be written to a NVM array.

More particularly, as illustrated in FIG. 11, the current control circuit 1100 comprises a bypass multiplexor (bypass MUX), controlled by the output of the logic (i.e., the data to be written). The bypass MUX accepts the output of data latches in the current I/O (e.g., "1") and the write data from latches of a prior I/O (e.g., "0"). Depending on the value to be written to memory (e.g., output by the logic 1110) the bypass MUX will either feed the value of the data latches in the current I/O to the next I/O or it will feed the value of the data latches of a prior I/O to the next I/O. For example, in FIG. 11, Bypass Mux1 of I/O 1 will either provide the data from latches 1106 and 1108 to the next I/O or it will provide the data from latches 1102 and 1104 to the next I/O depending on the value to be written to memory, output by logic 1110. Accordingly, the control circuit 1100 skips the bit lines associated with low data states and executes bit lines associated with high data states. In other words, the scan path is configured to only contain the shift register flip flops (built for example from latches 1102 and 1104 or 1106 and 1108) that are associated with data bits '1', (i.e. bits that are to be written).

In an additional embodiment, the output of the shift register may be fed back to the controller. During a still active write operation, the output will comprise high data states. Once the controller receives a low data state it becomes aware that all data bits have been written and that writing the data word is complete.

Although the invention has been illustrated and described with respect to one or more implementations, alterations and/or modifications may be made to the illustrated examples without departing from the spirit and scope of the appended claims. For example, although the invention has been described with respect to a NOR flash memory array it will be appreciated that the method described herein may be applied to various memory architectures.

Furthermore, in regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A write throughput control circuit, comprising:
a control circuit configured to:
activate at least one word line;
write a first data bit to a first memory cell associated with the activated word line by providing a first write bias condition; and
write a next data bit to a next memory cell associated with the activated word line by providing a next write bias condition;
a shift register configured to delay the control circuit from providing the first write bias condition and the next write bias condition by a non-zero write window interleaving time, thereby resulting in the first data bit and the next data bit being written at different times to different memory cells of the activated word line.

2. The circuit of claim 1, wherein a maximum write current of the control circuit is less than a sum of the maximum of the first and next bias conditions.

3. The circuit of claim 2, wherein:
a first clock signal activates the first write bias condition used to write the first data bit, and
a next clock signal, provided chronologically after the first clock signal, activates the next write bias condition used to write the next data bit.

4. The circuit of claim 3, wherein the write window interleaving time between the first and the next clock signal can be dynamically adjusted to allow for a flexible write window interleaving time.

5. The circuit of claim 1, wherein the write window interleaving time comprises a time value that allows the first write bias condition to decrease below a certain predetermined non-zero threshold prior to writing the next data bit.

6. The circuit of claim 1, wherein the write window interleaving time is chosen to provide a total write current that is substantially uniform over a time for writing an entire data word.

7. The circuit of claim 1, wherein the control circuit comprises a plurality of I/O's, each having a multiplexor and a data-in latch, coupled to a flip-flop of the shift register.

8. The circuit of claim 7, further comprising a circuitry configured to allow the shift register to bypass one or more flip-flops of the shift register depending on a value of data bits to be written by one of the plurality of I/O's of the control circuit.

9. The circuit of claim 8, wherein the circuitry comprises a bypass multiplexor.

10. The circuit of claim 8, wherein the output of the shift register is fed back to the control circuit, thereby allowing the control circuit to determine when writing of a data word is completed.

11. The method of claim 10, wherein the first and next bit lines are activated using a clock signal having a frequency that can be dynamically adjusted.

12. A method for improving operating speed of a memory array, comprising:

activating a word line of the memory array from a first time to a next time;

activating a first bit line at the first time to write a first data bit to a first memory cell associated with the activated word line; and activating a next bit line at the next time to write a next data bit to a next memory cell associated with the activated word line, wherein the first time and the next time are different;

wherein activating the word line for an entire time period that encompasses the activation of the first bit line and next bit line results in a maximum write current of the first data bit that is offset in time from a maximum write current of the next data bit.

13. The method of claim 12, wherein:

activating the first bit line comprises applying a first write bias condition, activating the next bit line comprises applying a next write bias condition, and a maximum value of the first write bias condition and a maximum value of the next write bias condition are not coincident in time.

14. The method of claim 12, further comprising:

determining a write window interleaving time that is less than a time used to write an entirety of the first data bit to the first memory cell, wherein the first time and the next time are separated by the write window interleaving time.

15. The method of claim 14, wherein the write window interleaving time may be dynamically adjusted over time.

16. The method of claim 14, wherein the write window interleaving time is chosen to provide a total write current that is substantially uniform over a time for writing an entire data word.

17. The method of claim 14, wherein the write window interleaving time comprises a time value that allows first write bias condition to decrease below a certain predetermined non-zero threshold prior to writing the next data bit.

18. The method of claim 12, wherein the first data bit and the next data bit contain high data states, thereby resulting in a method that bypasses writing low data states.

19. A method for improving operating speed of a memory array, comprising:

writing a first data bit to a first memory cell at a first clock signal;

determining a write window interleaving time that is less than a time used to write an entirety of the first data bit to the first memory cell; and writing a next data bit to next memory cell at a next clock signal offset in time from the first clock signal by the write window interleaving time.

20. The method of claim 19, wherein the first and second memory cells are associated with a word line; and wherein the first clock signal and next clock signal elapse between the word line being activated and deactivated.

* * * * *